(12) United States Patent
Hernando et al.

(10) Patent No.: US 8,466,691 B2
(45) Date of Patent: Jun. 18, 2013

(54) DETERMINATION OF INSULATION RESISTANCE OF AN ELECTRIC DC CIRCUIT

(75) Inventors: Serge Hernando, Cergy (FR); Yoann Leblanc, Holland, MI (US); Julien Fouques, Cergy le Haut (FR)

(73) Assignee: Johnson Controls-Saft Advanced Power Solutions LLC, Wilmington, DE (US)

( * ) Notice: Subject to any disclaimer, the term of this patent is extended or adjusted under 35 U.S.C. 154(b) by 326 days.

(21) Appl. No.: 12/963,549

(22) Filed: Dec. 8, 2010
(Under 37 CFR 1.47)

(65) Prior Publication Data

US 2011/0140714 A1    Jun. 16, 2011

(30) Foreign Application Priority Data

Dec. 10, 2009  (EP) .................................. 09015291

(51) Int. Cl.
*H01H 31/12* (2006.01)
*G01R 27/08* (2006.01)

(52) U.S. Cl.
USPC ........................................... 324/551; 324/713

(58) Field of Classification Search
USPC .................................................. 324/551, 713
See application file for complete search history.

(56) References Cited

U.S. PATENT DOCUMENTS

| | | | |
|---|---|---|---|
| 4,117,397 A | 9/1978 | Fukao et al. | |
| 6,952,103 B2 * | 10/2005 | Herb et al. | 324/500 |
| 7,317,316 B2 * | 1/2008 | Leitz | 324/551 |
| 7,576,547 B2 * | 8/2009 | Muller | 324/522 |
| 2007/0285057 A1 | 12/2007 | Yano | |
| 2008/0079404 A1 | 4/2008 | Hayakawa et al. | |
| 2011/0115490 A1* | 5/2011 | Klijn | 324/430 |

FOREIGN PATENT DOCUMENTS

| | | |
|---|---|---|
| DE | 103 04 234 A1 | 8/2004 |
| EP | 1 289 094 A1 | 3/2003 |
| EP | 1 437 600 A1 | 7/2004 |
| EP | 1 857 825 A1 | 11/2007 |
| EP | 1 898 227 A1 | 12/2008 |
| GB | 2 317 278 A | 3/1998 |

OTHER PUBLICATIONS

Response to European Search Report for European Application No. 09 01 5291, mailing date of Dec. 19, 2011, 16 pages.
European Search Report for European Application No. EP 09 01 5291, date of mailing, May 7, 2010, 9 pages.

* cited by examiner

*Primary Examiner* — Jeff Natalini
(74) *Attorney, Agent, or Firm* — Foley & Lardner LLP

(57) ABSTRACT

A method for determining an insulation resistance of an electric DC circuit having at least a first and a second terminal includes performing a measurement cycle, verifying whether the change of a measured current exceeds a predetermined change rate, calculating a total insulation resistance, and calculating a first insulation resistance between the first terminal and a reference potential and a second insulation resistance between the second terminal and the reference potential. An insulation resistance measurement circuit is also provided for carrying out the aforementioned method.

15 Claims, 3 Drawing Sheets

DETERMINATION OF INSULATION RESISTANCE OF AN ELECTRIC DC CIRCUIT

CROSS-REFERENCE TO RELATED PATENT APPLICATIONS

The present application claims the benefit of and priority to European Patent Application No. 09015291.9, filed Dec. 10, 2009, the entire disclosure of which is incorporated herein by reference.

BACKGROUND

The present application relates generally to the field of methods for determining an insulation resistance of an electric DC circuit having at least a first and a second terminal. The application also relates to an insulation resistance measurement circuit for determining an insulation resistance of an electric DC circuit having at least a first and a second terminal.

It may be desirable to determine the insulation resistances between any two terminals in direct current (DC) circuits, such as with two separated DC networks.

It would also be desirable for the ability to make such a determination in the area of electrically-driven vehicles, such as hybrid vehicles or purely electrically-energized vehicles. In such vehicles, a high energy battery is required to provide the required amount of electrical energy necessary for being suitable as a traction battery for a vehicle. Compared with known 12-Volt batteries in vehicles, a traction battery usually requires a considerably higher voltage, in order to keep the required current in an acceptable range. Due to the higher voltage, in order to prevent passengers to get in contact with the high voltage and to avoid an electric shock, it is important to guarantee a sufficient insulation of the battery or, in general, of the electric DC circuit. For safety reasons, it is therefore required to monitor the insulation resistance in a permanent manner.

It would be advantageous to provide an easy to use solution for determination of an insulation resistance of an electric DC circuit which can be implemented with a battery management system in a cost-effective manner. It would be advantageous to provide these or other features as may be apparent from a review of the various exemplary embodiments described herein.

SUMMARY

An exemplary embodiment relates to a method for determining an insulation resistance of an electric DC circuit having at least a first terminal and a second terminal. The method comprises performing a measurement cycle comprising (a) measuring at least one first terminal voltage sample between the first terminal and a reference potential and at least one first high voltage sample between the first terminal and the second terminal; (b) measuring at least one second terminal voltage sample between the second terminal and the reference potential and at least one second high voltage sample between the first terminal and the second terminal; and (c) measuring samples of the current drawn between the first terminal and the second terminal, the current samples being taken at least immediately before and after the voltage samples of the measurement cycle are taken. The method also comprises verifying that the change of the measured current does not exceed a predetermined change rate, using the current samples. The method further comprises calculating a total insulation resistance from the first and second terminal voltage samples and the first and second high voltage samples of the measurement cycle and from resistance values of a measurement circuit. The method further comprises calculating a first insulation resistance between the first terminal and the reference potential and a second insulation resistance between the second terminal and the reference potential, each of the first and second insulation resistances being calculated from the total insulation resistance, the first and second terminal voltage samples and the first and second high voltage samples of the measurement cycle and from resistance values of the measurement circuit.

Another exemplary embodiment relates to an insulation resistance measurement circuit for determining an insulation resistance of an electric DC circuit having at least a first and a second terminal. The insulation resistance measurement circuit comprises a measurement circuit with a voltage sensing connection and a reference potential connection. The insulation resistance measurement circuit also comprises a switch for connecting the voltage sensing connection either to the first terminal or to the second terminal, and a device for sensing a high voltage between the first and the second terminal and a device for sensing the current drawn between the first and the second terminal. The insulation resistance measurement circuit is configured to carry out a method comprising performing a measurement cycle comprising (a) measuring at least one first terminal voltage sample between the first terminal and a reference potential and at least one first high voltage sample between the first terminal and the second terminal; (b) measuring at least one second terminal voltage sample between the second terminal and the reference potential and at least one second high voltage sample between the first terminal and the second terminal; and (c) measuring samples of the current drawn between the first terminal and the second terminal, the current samples being taken at least immediately before and after the voltage samples of the measurement cycle are taken. The method also comprises verifying that the change of the measured current does not exceed a predetermined change rate, using the current samples. The method further comprises calculating a total insulation resistance from the first and second terminal voltage samples and the first and second high voltage samples of the measurement cycle and from resistance values of a measurement circuit. The method further comprises calculating a first insulation resistance between the first terminal and the reference potential and a second insulation resistance between the second terminal and the reference potential, each of the first and second insulation resistances being calculated from the total insulation resistance, the first and second terminal voltage samples and the first and second high voltage samples of the measurement cycle and from resistance values of the measurement circuit.

BRIEF DESCRIPTION OF THE DRAWINGS

In the drawings, like reference numbers are used for identical elements.

DETAILED DESCRIPTION

Figure 1:
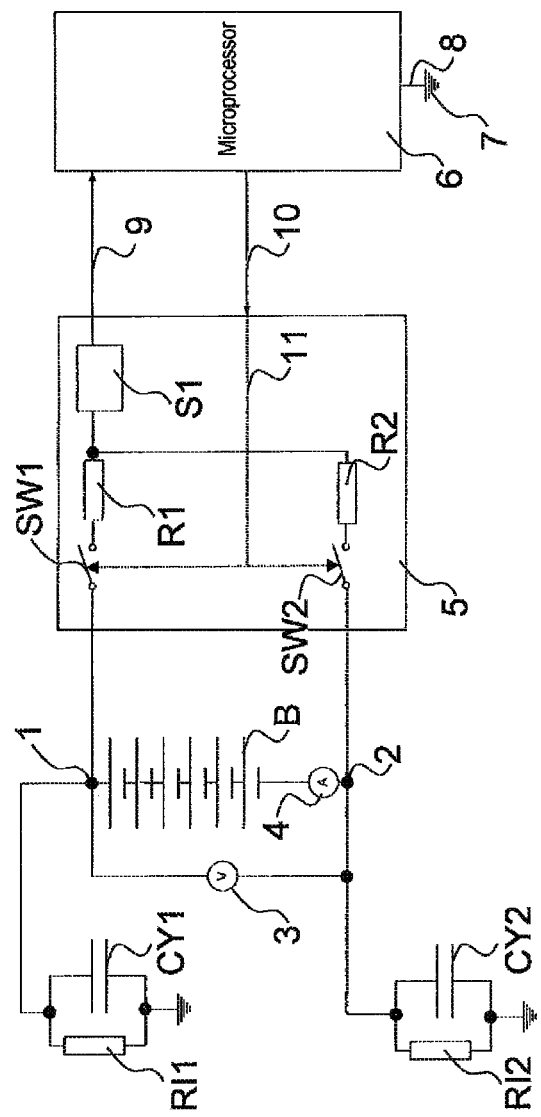
FIG. 1 schematically depicts a circuit diagram of a first exemplary embodiment.

According to an exemplary embodiment, a method for determining an insulation resistance of an electric DC circuit having at least a first and a second terminal, includes a measurement cycle that includes (a) measuring at least one first terminal voltage sample between the first terminal and a reference potential and at least one first high voltage sample between the first and the second terminal, (b) measuring at least one second terminal voltage sample between the second terminal and the reference potential and at least one second high voltage sample between the first and the second terminal, and (c) measuring samples of the current drawn between the first and the second terminal, the current samples are taken at least immediately before and after voltage samples of the measurement cycle are taken. The measurement cycle also includes verifying whether the change of the measured current is not exceeding a predetermined change rate, using the current samples. The measurement cycle also includes calculating a total insulation resistance from the first and second terminal voltage samples and the first and second high voltage samples of the measurement cycle and from resistance values of a measurement circuit. The measurement cycle further includes calculating a first insulation resistance between the first terminal and the reference potential and a second insulation resistance between the second terminal and the reference potential, each of the first and second insulation resistances being calculated from the total insulation resistance, the first and second terminal voltage samples and the first and second high voltage samples of the measurement cycle and from resistance values of the measurement circuit.

The first terminal voltage can be measured, for example, through a first analog-to-digital conversion channel in a microprocessor, and the second terminal voltage sample can be measured by a separate, second analog-to-digital conversion channel in the same microprocessor or in a separate microprocessor. In case of separate microprocessors, the microprocessors are connected via a data communication line to exchange information about the measured terminal voltage samples.

It is further advantageous to measure the first terminal voltage sample and the second terminal voltage sample via the same analog-to-digital conversion channel of a microprocessor. In this case, a switch means is provided for connecting the analog-to-digital conversion channel either with the first terminal or with the second terminal.

It is further advantageous that the current drawn between the first and the second terminal is monitored during measuring of the voltage samples. By such current monitoring, the variation of the current over time can be checked. This allows performing the several voltage measuring steps in dependence of the rate of change of the measured current. In case the change of the measured current is deemed too high for an accurate measuring of the voltage samples, the measured values can be discarded, and new voltage samples can be measured when the rate of change of the measured current is in an appropriate range. For example, it is possible to take a new sample of the first terminal voltage, the second terminal voltage, the first high voltage and/or the second high voltage after a delay if it is detected that the change of the measured current exceeds the predetermined change rate. Thus, a waiting step can be included for improving the accuracy of the measured voltage samples.

An advantageous value for the predetermined change rate of the measured current is 200 A/s, although those reviewing the present disclosure will appreciate that other values are possible according to other exemplary embodiments.

It is further advantageous to determine the delay in dependence from decoupling capacities of the electric DC circuit relative to the reference potential and from resistance values of the measurement circuit. In addition, assumed standard resistance values of the insulation could be taken into account for determining the delay. However, according to an exemplary embodiment, the resistance values of the insulation can be neglected under the assumption that the resistance values of the insulation are much higher than the resistance values of the measurement circuit. For purposes of determining the delay, the resistance values of the measurement circuit can be assumed as being connected in parallel to the resistance values of the insulation.

Further, it is advantageous to perform the measuring of the at least one first terminal voltage sample and the at least one first high voltage sample closely together, which means at the same time or at least within a relatively short time frame. This ensures that the measured samples interrelate with each other which ensures a required level of accuracy of the result of the determination of the insulation resistance. According to an exemplary embodiment, the delay between measuring the first terminal voltage and the first high voltage sample is less than 50 ms. The same applies to the measurement of the second terminal voltage sample and the second high voltage sample.

According to an exemplary embodiment, a total insulation resistance is calculated from the measured values, namely from the first and second terminal voltage samples and the first and second high voltage samples of the measurement cycle, and from resistance values of a measurement circuit. According to an exemplary embodiment, it may be advantageous to discriminate between a first insulation resistance between the first terminal and reference potential and a second insulation resistance between the second terminal and the reference potential. These individual first and second insulation resistances may be calculated from the total insulation resistance, the first and second terminal voltage samples and the first and second high voltage samples of the measurement cycle, and from resistance values of the measurement circuit. This provides for detailed information and an overview about the insulation status of the electric DC circuit. It is particularly possible to detect insulation deficiencies early and to provide information about the location of the deficiency.

According to an exemplary embodiment, a plurality of samples of the first terminal voltage, the second terminal voltage, the first high voltage and/or the second high voltage are measured within a measurement cycle. The insulation resistance is then calculated from the plurality of samples. It is possible to apply the concept of measuring a plurality of samples only to one of the first terminal voltage, the second terminal voltage, the first high voltage or the second high voltage, or to a group of them or to each of them. This depends on the required accuracy and possible external noise signals. According to an exemplary embodiment, the plurality of samples are converted into a filtered value by applying a step of filtering of the plurality of samples. Any type of digital filtering method can be applied like a digital low pass filter or the calculation of an average value of the plurality of samples.

According to an exemplary embodiment, the reference potential is a common ground potential of a reference electric DC circuit. In case where the various embodiments described herein are used in the context of an electrical vehicle, the reference potential can be a vehicle ground such as the vehicle chassis.

According to an exemplary embodiment, an insulation resistance measurement circuit for determining an insulation resistance of an electric DC circuit having at least a first and a second terminal includes a measurement circuit with a voltage sensing connection and a reference potential connection, with a switch means for connecting the voltage sensing connection either to the first terminal or to the second terminal, and means for sensing a high voltage between the first and the second terminal and means for sensing the current drawn between the first and the second terminal.

It is further advantageous to operate the insulation resistance measurement circuit according to the aforementioned methods.

Those reviewing the present application will appreciate that the various exemplary embodiments described herein may provide a number of advantages. For example, the various exemplary embodiments provide an easy and cheap implementation of the safety feature of an insulation resistance determination with known, existing battery management systems. A battery management system is a device which checks the status of the battery, in particular of the traction battery of an electric vehicle. The battery management system can also check the status of each single cell of the battery, or of groups of cells. The battery management system can further control charging and discharging of the cells and can suppress overcharging and over-discharging of the cells. Further, the battery management system can provide data to be displayed to a user of the battery, like battery status values.

Very little hardware is required (e.g., ohmic resistors and, according to certain exemplary embodiments, electric or electronic switches controllable by a microprocessor). The embodiments discussed herein can be implemented as a software module in a microprocessor, for example, as a subroutine in an existing battery management system.

FIG. 1 shows an electric DC circuit comprising a battery B which is connected to a first terminal 1 and a second terminal 2. A current sensing means 4 is connected in series with the battery B between the battery and the second terminal 2. The battery B has a positive terminal which is connected to the first terminal 1 and a negative terminal which is connected via the current sensing means 4 to the second terminal 2. Further, there is a voltage sensing means 3 connected to the first terminal 1 and the second terminal 2. The voltage sensing means senses a high voltage between the first and the second terminals 1, 2.

FIG. 1 further shows an equivalent circuit diagram of the insulation impedance of the first terminal 1 with regard to a reference potential, which can be the common ground potential for the reference electric DC circuit. The equivalent circuit diagram represents the insulation impedance of the first terminal 1 by means of an insulation resistance RI1 and a decoupling capacity CY1, which are located in parallel between the first terminal 1 and the reference potential 7. Similarly, FIG. 1 shows an equivalent circuit diagram of the insulation impedance of the second terminal 2 with regard to the reference potential 7 shown. The equivalent circuit diagram comprises a second insulation resistance RI2 and a second decoupling capacity CY2, which are located in parallel between the second terminal 2 and the reference potential 7.

FIG. 1 further shows an insulation resistance measurement circuit 5, 6 which comprises a signal sensing network 5 and a microprocessor 6. The signal sensing network 5 comprises a first switch SW1 which allows connection of the first terminal 1 to a first sensing resistor R1. In addition, the signal sensing circuit 5 comprises a second switch SW2 which allows connection of the second terminal 2 to a second sensing resistor R2. The switches SW1, SW2 are on/off-switches which are controllable via control lines 10, 11 from the microprocessor 6. The microprocessor can control the switches SW1, SW2 in a way that either SW1 or SW2 is closed, but not both at the same time. The switches SW1, SW2 can be semiconductor switches or galvanic contacts, e.g. relays.

The first sensing resistor R1 and the second sensing resistor R2 are both connected to a signal conditioning element S1 which may comprise, for example, a low pass filter built of a resistor and a capacitor. The signal conditioning element S1 provides an output signal which is a measure of the voltage of either the first terminal 1 or the second terminal 2 via an output line 9 to the microprocessor 6. The output line 9 is connected, for example, to an analog-to-digital conversion channel of the microprocessor 6. The signal conditioning element S1 may comprise further elements, for example, electronic circuit elements suggested by the manufacturer of the microprocessor for applying signals to the analog-to-digital conversion channel.

The microprocessor 6 is connected via a line 8 to the reference potential 7. The microprocessor 6, the voltage sensing means 3 and/or the current sensing means 4 can be part of a battery management system which is already present in a vehicle for control and management of the battery B. The current sensing means 4 may comprise a shunt resistor for current to voltage transformation.

Figure 2:
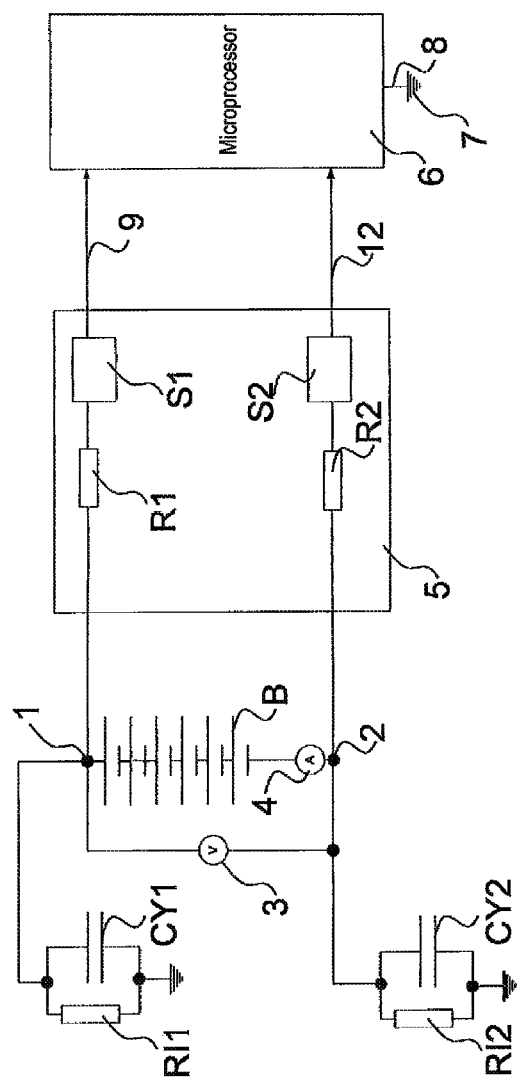
FIG. 2 schematically depicts a circuit diagram of a second exemplary embodiment.

FIG. 2 shows a similar arrangement as FIG. 1. One difference from the arrangement shown in FIG. 1 is the signal sensing circuit 5 which comprises the first signal conditioning element S1 connected in series with the first sensing resistor R1, and a second signal conditioning element S2 connected in series with the second sensing resistor R2. Instead of using switches SW1, SW2 to alternatively connect the different terminals 1, 2 to only one analog-to-digital conversion channel, FIG. 2 shows an embodiment where two separate analog-to-digital conversion channels of the microprocessor 6 are used. The voltage from the first terminal 1 is fed through the first sensing resistor R1, the first signal conditioning element S1 and the line 9 to a first analog-to-digital conversion channel of the microprocessor 6. The voltage of the second terminal 2 is fed through the second sensing resistor R2, the second signal conditioning element S2 and a line 12 to a second analog-to-digital conversion channel of the microprocessor 6. The second signal conditioning element S2 can be designed in the same way as the first signal conditioning element S1. The embodiment of FIG. 2 avoids the necessity of two switching elements SW1, SW2, but requires a second analogue to digital conversion channel of the microprocessor. Therefore, both of the embodiments of FIG. 1 and FIG. 2 are advantageous for specific requirements.

Figure 3:
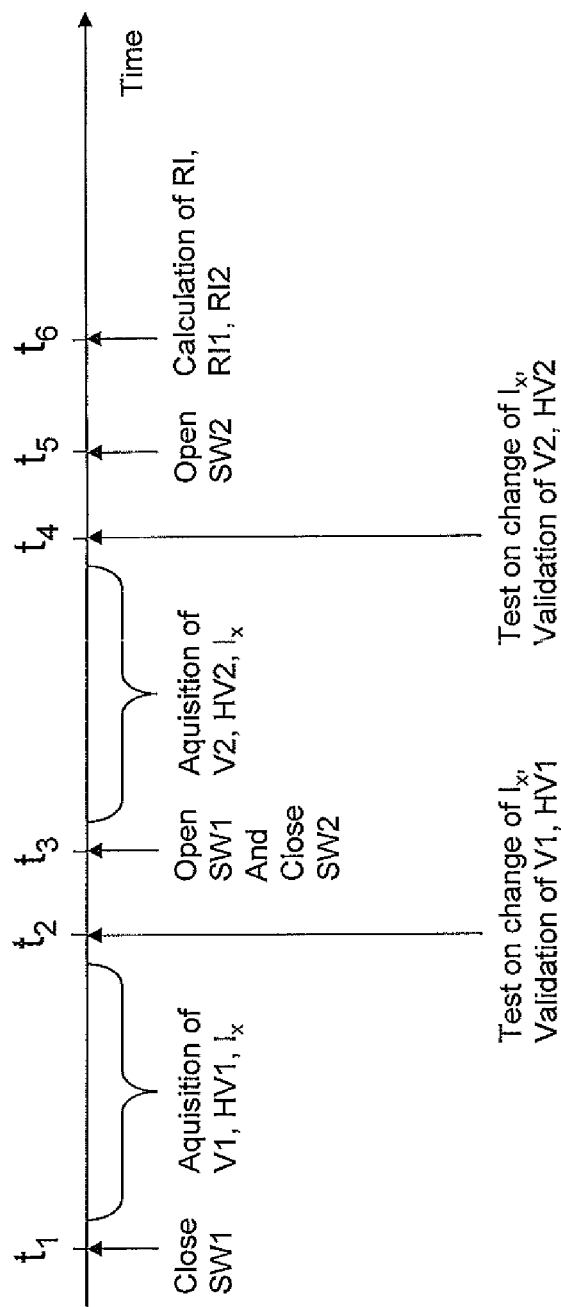
FIG. 3 depicts a timing diagram of a method according to an exemplary embodiment.

FIG. 3 shows a timing diagram of a method for determining an insulation resistance of an electric DC circuit, as aforementioned in connection with FIG. 1. At a point of time $t_1$ the switch SW1 is closed by a signal from the microprocessor 6. After a short delay a data acquisition phase is performed. During the data acquisition phase, the voltage at the first terminal 1 is measured as a plurality of first terminal voltage samples V1 in the microprocessor 6 by converting the signal fed through the line 9 to the microprocessor. Also, the voltage sensed by the voltage sensing means 3 is sampled in the microprocessor as a first high voltage sample HV1. Concurrently, samples of the current sensed by the current sensing means 4 are taken in the microprocessor 6 as current samples $I_x$. The data acquisition phase is then finished. Then, at a point of time $t_2$, the rate of change of the measured current I is determined by comparing the current samples $I_x$, for example, by comparing the last current sample with the first current sample. It is verified whether the change of the measured current is below or above a predetermined change rate which is defined for ensuring certain accuracy for the voltage samples V1 and HV1. If the measured current does not exceed the predetermined change rate, the first terminal voltage sample V1 and the first high voltage sample HV1 are stored in the microprocessor as valid samples.

In case the measured current exceeds the predetermined change rate, a new sample of the first terminal voltage V1 and the first high voltage HV1 is taken after a delay DT. The delay DT is calculated e.g. by the following formula:

$$DT = K \cdot (CY1 + CY2) \cdot (R1 + R_{S1})$$

where K is a proportional constant to be defined for the specific environment, which can for example have the value 1.5, and $R_{S1}$ is the ohmic resistance of the first signal conditioning element S1.

Then, at a point in time $t_3$ the first switch SW1 is opened and the second switch SW2 is closed through a signal from the microprocessor 6. After a short delay, another data acquisition phase is performed. During the data acquisition phase, the second terminal voltage sample V2 and the second high voltage sample HV2 are measured in the same way as described before. Concurrently, the current I is measured. The data acquisition phase is then finished. Then, at a point of time $t_4$, the second terminal voltage sample V2 and the second high voltage sample HV2 are then validated in the same way by verifying whether the change of the measured current is not exceeding a predetermined change rate as explained before.

In case the measured current exceeds the predetermined change rate, a new sample of the first terminal voltage V2 and the first high voltage HV2 is taken after a delay DT, which is calculated for example by the following formula:

$$DT = K \cdot (CY1 + CY2) \cdot (R2 + R_{S1})$$

Then, at a point in time $t_5$, the total insulation resistance RI and the first and second insulation resistances RI1, RI2 are calculated based on the validated first and second voltage samples V1, V2 and the first and second high voltage samples HV1, HV2 and from resistance values of elements R1, R2, S1, S2. The calculation can be done e.g. by the following formulas:

$$RI1 = \frac{HV1 \cdot RI \cdot R_{S1M}}{2 \cdot V1 \cdot RI - V_{DD} \cdot RI + V1 \cdot (R_{S1M} + 2 \cdot R1 + 2 \cdot R_{S1S}) - V_{DD} \cdot (R1 + R_{S1S})}$$

$$RI2 = \frac{HV2 \cdot RI \cdot R_{S1M}}{-2 \cdot V2 \cdot RI + V_{DD} \cdot RI - V2 \cdot (R_{S1M} + 2R1 + 2R_{S1S}) + V_{DD} \cdot (R1 + R_{S1S})}$$

The total insulation resistance can be assumed as a parallel circuit of the first insulation resistance RI1 and second insulation resistance RI2, and can therefore be calculated e.g. by using the following formula:

$$RI = \frac{R_{S1M} + \frac{V2 \cdot (R_{S1M} + 2R1 + 2R_{S1S}) - V_{DD} \cdot (R1 + R_{S1S})}{HV2} - \frac{V1 \cdot (R_{S1M} + 2 \cdot R1 + 2 \cdot R_{S1S}) - V_{DD} \cdot (R1 + R_{S1S})}{HV1}}{\frac{V_{DD} - 2V2}{HV2} - \frac{2V1 - V_{DD}}{HV1}}$$

$V_{DD}$ is the reference voltage of analog-to-digital conversion channel, $R_{S1M}$ is the ohmic resistance of the first signal conditioning element S1 to the reference potential 7, $R_{S1S}$ is the ohmic resistance of the first signal conditioning element S1 between R1 resp. R2 and the microprocessor 6.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURE S. It should be noted that the orientation of various elements may differ according to other exemplary embodiments, and that such variations are intended to be encompassed by the present disclosure.

It is important to note that the construction and arrangement of the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A method for determining an insulation resistance of an electric DC circuit having at least a first terminal and a second terminal, the method comprising:
   (a) performing a measurement cycle comprising:
      measuring at least one first terminal voltage sample between the first terminal and a reference potential and at least one first high voltage sample between the first terminal and the second terminal;
      measuring at least one second terminal voltage sample between the second terminal and the reference potential and at least one second high voltage sample between the first terminal and the second terminal; and measuring samples of the current drawn between the first terminal and the second terminal, the current samples being taken at least immediately before and after the voltage samples of the measurement cycle are taken;

(b) verifying that the change of the measured current does not exceed a predetermined change rate, using the current samples;

(c) calculating a total insulation resistance from the first and second terminal voltage samples and the first and second high voltage samples of the measurement cycle and from resistance values of a measurement circuit; and (d) calculating a first insulation resistance between the first terminal and the reference potential and a second insulation resistance between the second terminal and the reference potential, each of the first and second insulation resistances being calculated from the total insulation resistance, the first and second terminal voltage samples and the first and second high voltage samples of the measurement cycle and from resistance values of the measurement circuit.

2. The method of claim 1, further comprising verifying that the change of the measured current does not exceed a predetermined change rate, and if the change of the measured current does exceed the predetermined change rate, measuring a new sample of at least one of the first terminal voltage, the second terminal voltage, the first high voltage or the second high voltage is taken after a delay.

3. The method of claim 2, further comprising determining the delay in dependence from decoupling capacities of the electric DC circuit relative to the reference potential and from resistance values of the measurement circuit.

4. The method of claim 1, further comprising measuring a plurality of samples of at least one of the first terminal voltage, the second terminal voltage, the first high voltage or the second high voltage in a measurement cycle, and calculating the insulation resistance from the plurality of samples by calculating a filtered value of the associated first terminal voltage, the second terminal voltage, the first high voltage or the second high voltage through filtering of the plurality of samples.

5. The method claim 1, further comprising measuring the first and second terminal voltage samples by switching the measurement circuit either to the first terminal or to the second terminal, and taking samples of at least one of the first terminal voltage, the second terminal voltage, the first high voltage or the second high voltage when a stabilization time has elapsed after switching the measurement circuit.

6. The method of claim 1, wherein the electric DC circuit comprises a battery having a positive and a negative terminal, the positive terminal being connected to the first terminal, the negative terminal being connected to the second terminal.

7. The method of claim 1, wherein the reference potential is a common ground potential of a reference electric DC circuit.

8. An insulation resistance measurement circuit for determining an insulation resistance of an electric DC circuit having at least a first and a second terminal, the insulation resistance measurement circuit comprising:

a measurement circuit with a voltage sensing connection and a reference potential connection;

a switch for connecting the voltage sensing connection either to the first terminal or to the second terminal, and a device for sensing a high voltage between the first and the second terminal and a device for sensing the current drawn between the first and the second terminal;

wherein the insulation resistance measurement circuit is configured to:

(a) perform a measurement cycle comprising:

measuring at least one first terminal voltage sample between the first terminal and a reference potential and at least one first high voltage sample between the first terminal and the second terminal;

measuring at least one second terminal voltage sample between the second terminal and the reference potential and at least one second high voltage sample between the first terminal and the second terminal; and measuring samples of the current drawn between the first terminal and the second terminal, the current samples being taken at least immediately before and after the voltage samples of the measurement cycle are taken;

(b) verify that the change of the measured current does not exceed a predetermined change rate, using the current samples;

(c) calculate a total insulation resistance from the first and second terminal voltage samples and the first and second high voltage samples of the measurement cycle and from resistance values of a measurement circuit; and (d) calculate a first insulation resistance between the first terminal and the reference potential and a second insulation resistance between the second terminal and the reference potential, each of the first and second insulation resistances being calculated from the total insulation resistance, the first and second terminal voltage samples and the first and second high voltage samples of the measurement cycle and from resistance values of the measurement circuit.

9. The insulation resistance measurement circuit of claim 8, wherein the switch comprising a first switch connected to the first terminal and a second switch connected to the second terminal, and a common voltage measurement network connected to the first and second switches, whereby the measurement network is connectable through the first and the second switches to either the first terminal or the second terminal.

10. The insulation resistance measurement circuit of claim 8, further comprising a battery in the electric DC circuit, the battery having a positive and a negative terminal, wherein the positive terminal is connected to the first terminal and the negative terminal is connected to the second terminal.

11. The insulation resistance measurement circuit of claim 8, wherein the reference potential is a common ground potential of a reference electric DC circuit.

12. The insulation resistance measurement circuit of claim 8, wherein the insulation resistance measurement circuit is further configured to verify that the change of the measured current does not exceed a predetermined change rate, and if the change of the measured current does exceed the predetermined change rate, measure a new sample of at least one of the first terminal voltage, the second terminal voltage, and take the first high voltage or the second high voltage after a delay.

13. The insulation resistance measurement circuit of claim 8, wherein the insulation resistance measurement circuit is further configured to determine the delay in dependence from decoupling capacities of the electric DC circuit relative to the reference potential and from resistance values of the measurement circuit.

14. The insulation resistance measurement circuit of claim 8, wherein the insulation resistance measurement circuit is further configured to measure a plurality of samples of at least one of the first terminal voltage, the second terminal voltage, the first high voltage or the second high voltage in a measurement cycle, and calculate the insulation resistance from the plurality of samples by calculating a filtered value of the associated first terminal voltage, the second terminal voltage, the first high voltage or the second high voltage through filtering of the plurality of samples.

15. The insulation resistance measurement circuit of claim 8, wherein the insulation resistance measurement circuit is further configured to measure the first and second terminal voltage samples by switching the measurement circuit either to the first terminal or to the second terminal, and take samples of at least one of the first terminal voltage, the second terminal voltage, the first high voltage or the second high voltage when a stabilization time has elapsed after switching the measurement circuit.

* * * * *